United States Patent
Liu (10) Patent No.: US 10,263,220 B2
(45) Date of Patent: Apr. 16, 2019

(54) MANUFACTURING METHOD FOR QLED DISPLAY

(71) Applicant: Shenzhen China Star Optoelectronics Technology Co., Ltd., Shenzhen (CN)

(72) Inventor: Guohe Liu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 137 days.

(21) Appl. No.: 15/328,499

(22) PCT Filed: Dec. 19, 2016

(86) PCT No.: PCT/CN2016/110730
§ 371 (c)(1),
(2) Date: Jan. 24, 2017

(87) PCT Pub. No.: WO2018/068388
PCT Pub. Date: Apr. 19, 2018

(65) Prior Publication Data
US 2018/0219185 A1  Aug. 2, 2018

(30) Foreign Application Priority Data

Oct. 11, 2016 (CN) .......................... 2016 1 0891660

(51) Int. Cl.
*H01L 27/32* (2006.01)
*H01L 33/06* (2010.01)
(Continued)

(52) U.S. Cl.
CPC ............ *H01L 51/56* (2013.01); *H01L 27/322* (2013.01); *H01L 27/3248* (2013.01);
(Continued)

(58) Field of Classification Search
CPC . H01L 51/56; H01L 51/5028; H01L 51/5036; H01L 51/502; H01L 27/322;
(Continued)

(56) References Cited

U.S. PATENT DOCUMENTS 7,981,986 B2 * 7/2011 Hunt ..................... C08F 220/30
  526/280
9,817,264 B2 * 11/2017 Li ......................... H01L 33/504
(Continued)

FOREIGN PATENT DOCUMENTS

| CN | 103427049 A | | 12/2013 | |
|---|---|---|---|---|
| CN | 105301827 A | * | 2/2016 | ............... F21V 9/40 |
| CN | 105301827 A | | 2/2016 | |

*Primary Examiner* — Sophia T Nguyen
(74) *Attorney, Agent, or Firm* — Leong C. Lei (57) ABSTRACT

The manufacturing method for QLED display of the present invention uses the white QD layer to replace the organic light-emitting layer of the WOLED structure in the WOLED process, and adds the UV photoinitiator to the white QD layer. The QDs between the sub-pixels are irreversibly quenched by UV irradiation with mask to form fine QD pattern so as to eliminate the mutual influence between adjacent sub-pixels and effectively reduce the distance between two sub-pixels, increase the aperture ratio, and improve the color gamut and contrast of the display to enhance the color expression capability of the display. The manufacturing method is simple, and saves cost and process. Compared with the conventional TFT-LCD display, the QLED display of the present invention is not required to fabricate a liquid crystal cell separately, thinner and lighter, and has a longer lifetime and higher luminous efficiency than a conventional WOLED display.

14 Claims, 4 Drawing Sheets

(51) Int. Cl.
*H01L 51/50* (2006.01)
*H01L 51/52* (2006.01)
*H01L 51/56* (2006.01)

(52) U.S. Cl.
CPC ............ *H01L 33/06* (2013.01); *H01L 51/502* (2013.01); *H01L 51/5056* (2013.01); *H01L 51/5072* (2013.01); *H01L 51/5092* (2013.01); *H01L 51/5096* (2013.01); *H01L 51/5206* (2013.01); *H01L 51/5221* (2013.01); *H01L 2227/323* (2013.01)

(58) Field of Classification Search
CPC ............. H01L 27/3258; H01L 27/3246; H01L 21/02568; H01L 21/02543; H01L 21/02546; H01L 21/02557; H01L 21/0256; H01L 33/28; H01L 33/30; C23C 18/14; C23C 18/127; C23C 18/1295; C23C 18/1254; C23C 20/08; C09K 11/54; C09K 11/565; C09K 11/62; C09K 11/70; C09K 11/74; C09K 11/883; B82Y 20/00; B32B 2457/206
See application file for complete search history.

(56) References Cited

U.S. PATENT DOCUMENTS

| | | | | |
|---|---|---|---|---|
| 9,897,882 B1* | 2/2018 | Li | ................... | G03F 7/0007 |
| 9,947,842 B2* | 4/2018 | Li | ................... | F21V 9/40 |
| 2003/0129321 A1* | 7/2003 | Aoki | ................... | G02B 5/201 |
| | | | | 427/458 |
| 2005/0089772 A1* | 4/2005 | Kawaguchi | ........... | G02B 5/201 |
| | | | | 430/7 |
| 2006/0065902 A1* | 3/2006 | Todori | ................... | B82Y 20/00 |
| | | | | 257/79 |
| 2006/0279833 A1* | 12/2006 | Yoshimura | ............. | B82Y 10/00 |
| | | | | 359/321 |
| 2008/0007156 A1* | 1/2008 | Gibson | ................... | B82Y 20/00 |
| | | | | 313/503 |
| 2008/0203899 A1* | 8/2008 | Miller | ................... | C09K 11/883 |
| | | | | 313/499 |
| 2009/0079338 A1* | 3/2009 | Mori | ................... | H01L 51/5016 |
| | | | | 313/504 |
| 2010/0001256 A1* | 1/2010 | Coe-Sullivan | ......... | B82Y 20/00 |
| | | | | 257/13 |
| 2011/0049442 A1* | 3/2011 | Schreuder | ................ | C09K 11/02 |
| | | | | 252/519.2 |
| 2011/0057210 A1* | 3/2011 | Sonoda | ................ | H01L 27/322 |
| | | | | 257/88 |
| 2011/0095261 A1* | 4/2011 | Kazlas | ................... | B82Y 20/00 |
| | | | | 257/13 |
| 2012/0012877 A1* | 1/2012 | Bawendi | ................ | B82Y 10/00 |
| | | | | 257/98 |
| 2013/0009131 A1* | 1/2013 | Kazlas | ................... | B82Y 20/00 |
| | | | | 257/13 |
| 2013/0075692 A1* | 3/2013 | Naasani | ................ | B82Y 20/00 |
| | | | | 257/13 |
| 2014/0231766 A1* | 8/2014 | Kim | ................... | H01L 51/0048 |
| | | | | 257/40 |
| 2014/0374696 A1* | 12/2014 | Liu | ................... | H01L 51/502 |
| | | | | 257/13 |
| 2015/0179714 A1* | 6/2015 | Molaire | ................ | H01L 51/56 |
| | | | | 438/35 |
| 2015/0228697 A1* | 8/2015 | Liu | ................... | H01L 27/3244 |
| | | | | 257/40 |
| 2015/0243849 A1* | 8/2015 | Stroetmann | ......... | H01L 29/1606 |
| | | | | 257/13 |
| 2015/0380653 A1* | 12/2015 | Liu | ................... | H01L 51/502 |
| | | | | 257/13 |
| 2015/0380654 A1* | 12/2015 | Tang | ................... | H01L 51/502 |
| | | | | 257/13 |
| 2016/0020414 A1* | 1/2016 | Gu | ................... | C09K 11/025 |
| | | | | 252/512 |
| 2016/0064681 A1* | 3/2016 | Lee | ................... | H01L 51/502 |
| | | | | 257/13 |
| 2016/0248029 A1* | 8/2016 | Liu | ................... | H01L 51/001 |
| 2016/0254473 A1* | 9/2016 | Liu | ................... | H01L 51/0003 |
| | | | | 438/23 |
| 2016/0254474 A1* | 9/2016 | Zou | ................... | H01L 51/5221 |
| | | | | 257/40 |
| 2016/0276613 A1* | 9/2016 | Gu | ................... | H01L 51/502 |
| 2016/0293875 A1* | 10/2016 | Zhang | ................ | H01L 51/502 |
| 2017/0010405 A1* | 1/2017 | Lee | ................... | G02B 6/0065 |
| 2017/0025630 A1* | 1/2017 | Seo | ................... | C07F 15/0033 |
| 2017/0062749 A1* | 3/2017 | Seo | ................... | H01L 51/502 |
| 2017/0084669 A1* | 3/2017 | Wolk | ................... | H01L 51/5268 |
| 2017/0115561 A1* | 4/2017 | Yang | ................... | G03F 7/0047 |
| 2017/0133614 A1* | 5/2017 | Gu | ................... | H01L 51/50 |
| 2017/0141334 A1* | 5/2017 | Zhao | ................... | H01L 51/0096 |
| 2017/0156651 A1* | 6/2017 | Arias | ................... | A61B 5/14552 |
| 2017/0199454 A1* | 7/2017 | Lee | ................... | G03F 7/032 |
| 2017/0205664 A1* | 7/2017 | Cho | ................... | G02B 6/005 |
| 2017/0254933 A1* | 9/2017 | Li | ................... | G02B 5/20 |
| 2017/0324054 A1* | 11/2017 | Ishisone | ............. | H01L 51/5028 |
| 2017/0352827 A1* | 12/2017 | Cho | ................... | H01L 51/502 |
| 2018/0006093 A1* | 1/2018 | Kim | ................... | G02B 5/3041 |
| 2018/0019371 A1* | 1/2018 | Steckel | ................ | C09K 11/75 |
| 2018/0026203 A1* | 1/2018 | Ikeda | ................ | H01L 51/0073 |
| | | | | 257/40 |
| 2018/0031909 A1* | 2/2018 | Liu | ................... | B05D 1/005 |
| 2018/0031911 A1* | 2/2018 | Liu | ................... | G02F 1/133514 |
| 2018/0031912 A1* | 2/2018 | Zhang | ................ | G02F 1/1335 |
| 2018/0101031 A1* | 4/2018 | Li | ................... | G02F 1/017 |
| 2018/0148638 A1* | 5/2018 | Ahn | ................... | H01L 51/502 |
| 2018/0219185 A1* | 8/2018 | Liu | ................... | H01L 51/56 |

* cited by examiner

MANUFACTURING METHOD FOR QLED DISPLAY

BACKGROUND OF THE INVENTION

1. Field of the Invention

The present invention relates to the field of panel display techniques, and in particular to a manufacturing method for QLED display.

2. The Related Arts

With the display technology continues to progress, the demands on the display quality of the device display quality are also getting higher. Quantum dots (QDs) are spherical semiconductor nanoparticles composed of elements of II-VI, III-V and IV-VI groups, and the particle size is between several nanometers and tens of nanometers. When the semiconductor material is gradually reduced to a certain critical size (1 to 20 nm), the wave property of the carriers becomes significant and the motion will be limited, resulting in an increase in kinetic energy. The corresponding electronic structure changes from the continuous the energy level structure of particles becomes the quasi-split discontinuity, a phenomenon that is called the quantum size effect. Therefore, for QD material, due to the existence of quantum size effect, the original continuous energy band becomes a discrete energy level structure, which can emit visible light by the external excitation.

The QDs of the more common II-VI, III-V and IV-VI groups conform to the quantum size effect, the properties vary regularly with size changing, and the absorption and emission wavelengths also vary with size. In addition, the QD luminescent material has the advantages of concentrated luminescence spectrum and high color purity, which can greatly improve the color gamut of the display and improve the color reproduction ability of the liquid crystal display (LCD).

The applications of QD in the display field can be divided into photoluminescence (PL) and electroluminescence (EL). The existing PL technology encapsulates three-color QDs of R (red), G (green) and B (blue) in a plastic film (QD film) or a glass tube (QD tube), and uses the conventional backlight to excite for light-emitting to achieve color gamut improvement. Although the above technologies are mature at present, there are still some problems to be improved. For example, for QD film or QD tube structure, the use of QD material is large, and the light utilization is usually not high for the use of white backlight excitation on mixed QDs.

The QD light-emitting diode (QLED) is an active electroluminescent device with QDS applied to displays, and is a self-luminescence diode like the organic light-emitting diode (OLED). Compared to PL technology, a separate thin film transistor (TFT) switch must be manufactured for each pixel, and the inorganic QD material cannot be used to form required pattern by evaporation as the organic light-emitting material in OLED. Therefore, the development of the high pixel density QD EL device has been limited to a certain extent. The industry's existing reports on QD EL devices are mostly monochrome devices, and the pixel density is low.

In the prior art, in order to realize the full-color display of the OLED display, an approach is to realize by the function overlay of the white organic light emitting diode (WOLED) and the color filter (CF) layer. The white light-emitting layer of the WOLED is formed by mixing and evaporating the red, green and blue emission fluorescent materials, and the red, green and blue photo-resist layers of the CF layer filter the white light emitted from the white light-emitting layer to achieve color display.

SUMMARY OF THE INVENTION

The object of the present invention is to provide a manufacturing method for QLED display, able to manufacture fine QD pattern, for effectively improving the color gamut and the contrast of the QLED display, and easy to execute to save the cost and the process.

To achieve the above object, the present invention provides a manufacturing method for QLED display, which comprises:

Step 1: providing a TFT array substrate, and forming, in the order of, a hole transport layer and an electron blocking layer on the TFT array substrate;

the TFT array substrate comprising a TFT layer, and an anode layer formed on the TFT layer; the TFT layer comprising a plurality of TFTs arranged in an array;

Step 2: coating a white QD layer on the electron blocking layer; the white QD layer comprising: red QDs, green QDs, blue QDs, and an ultraviolet photoinitiator;

Step 3: providing a mask, and using the mask to perform ultraviolet irradiation on the white QD layer; the mask comprises a light-transmitting portion and an opaque portion, and the white QD layer corresponding to the region underneath the light-transmitting portion during the ultraviolet irradiation so that the ultraviolet photoinitiator being subjected to ultraviolet light to cause irreversible quenching of the red, green and blue QDs in the region to form a plurality of sub-pixel spacing areas; the part of the white QD layer corresponding to the region underneath the opaque portion not affected by the ultraviolet light irradiation so as to form a plurality of sub-pixel areas arranged in an array and separated by the sub-pixel spacing areas, and the plurality of sub-pixel areas and the plurality of TFTs forming a one-to-one correspondence;

Step 4: forming an electron transport/injection layer on the white QD layer, and forming a cathode layer on the electron transport/injection layer to obtain a QLED substrate;

Step 5: providing a color filter (CF) substrate, assembling and packaging the CF substrate and the QLED substrate to obtain the QLED display.

According to a preferred embodiment of the present invention, Step 2 of the manufacturing method for the QLED display may optionally comprise:

Step 21: performing a surface process respectively on the red QDs, green QDs and blue QDs, then dissolving the red QDs, green QDs and blue QDs in a solvent and adding ultraviolet photoinitiator to obtain a mixed QD solution with the red QDs, green QDs, blue QDs and ultraviolet photoinitiator;

Step 22: coating the mixed QD solution on the electron blocking layer by spin coating or slit coating to obtain the white QD layer.

According to a preferred embodiment of the present invention, the Step 2 may specifically comprise:

Step 21': performing a surface process respectively on the red QDs, green QDs and blue QDs, so that the surface of the red QDs, green QDs and blue QDs comprising polar or non-polar radicals, and at this point, the red QDs and the blue QDs having the same surface polarity, the red QDs and the green QDs having opposite surface polarity, and then dissolving the red QDs, the green QDs and the blue QDs in a solvent with the same polarity of the surface polarity of the respective QDs, and adding ultraviolet photoinitiator respectively to obtain a red QD solution with red QDs and ultraviolet photoinitiator, a green QD solution with green QDs and ultraviolet photoinitiator, a blue QD solution with blue QDs and ultraviolet photoinitiator;

Step 22': coating in the order of the red QD solution, the green QD solution and the blue QD solution on the electron blocking layer by spin coating or slit coating to obtain the white QD layer.

According to a preferred embodiment of the present invention, in the white QD layer formed in Step 2, the ratio of the blue QDs to the green QDs is more than or equal to 4:1, the ratio of the green QDs to the red QDs is more than or equal to 1:1.

According to a preferred embodiment of the present invention, the red QDs, the green QDs, and the blue QDs are all QDs of core-shell structure formed by one or more of group II-VI semiconductor material, group III-V semiconductor material and group IV-VI semiconductor material, and the particle diameters of the red QDs, the green QDs, and the blue QDs are of 1 to 10 nm.

According to a preferred embodiment of the present invention, the ultraviolet photoinitiator is benzoin dimethylether or methyl benzoylformate.

According to a preferred embodiment of the present invention, in Step 3, the violet irradiation time is from 0.5 to 4 hours.

According to a preferred embodiment of the present invention, in Step 1, a spin coating or evaporation process is used to form in the order of a hole transport layer and an electron blocking layer, the material of the hole transport layer is PEDOT or Poly-TPD, and the material of the electron blocking layer is TFB or PVK.

According to a preferred embodiment of the present invention, in Step 4, a spin coating or evaporation process is used to form an electron transport/injection layer, and the material of the electron transport/injection layer is Alq3, TPBI, or ZnO nano-particles; the cathode layer is formed by an evaporation process, and the material of the cathode layer is silver or magnesium.

According to a preferred embodiment of the present invention, the CF substrate comprises a CF layer, and the CF layer comprises a plurality of red color-resist units, green color-resist units and blue color-resist units arranged alternately.

Another embodiment of the present invention provides a manufacturing method for QLED display, which comprises:

Step 1: providing a TFT array substrate, and forming, in the order of, a hole transport layer and an electron blocking layer on the TFT array substrate;

the TFT array substrate comprising a TFT layer, and an anode layer formed on the TFT layer; the TFT layer comprising a plurality of TFTs arranged in an array;

Step 2: coating a white QD layer on the electron blocking layer; the white QD layer comprising: red QDs, green QDs, blue QDs, and an ultraviolet photoinitiator;

Step 3: providing a mask, and using the mask to perform ultraviolet irradiation on the white QD layer; the mask comprises a light-transmitting portion and an opaque portion, and the white QD layer corresponding to the region underneath the light-transmitting portion during the ultraviolet irradiation so that the ultraviolet photoinitiator being subjected to ultraviolet light to cause irreversible quenching of the red, green and blue QDs in the region to form a plurality of sub-pixel spacing areas; the part of the white QD layer corresponding to the region underneath the opaque portion not affected by the ultraviolet light irradiation so as to form a plurality of sub-pixel areas arranged in an array and separated by the sub-pixel spacing areas, and the plurality of sub-pixel areas and the plurality of TFTs forming a one-to-one correspondence;

Step 4: forming an electron transport/injection layer on the white QD layer, and forming a cathode layer on the electron transport/injection layer to obtain a QLED substrate;

Step 5: providing a color filter (CF) substrate, assembling and packaging the CF substrate and the QLED substrate to obtain the QLED display;

wherein the CF substrate comprising a CF layer and CF layer comprising a plurality of red color-resist units, green color-resist units and blue color-resist units arranged alternately;

wherein the ultraviolet photoinitiator being benzoin dimethylether or methyl benzoylformate.

Compared to the known techniques, the present invention provides the following advantages. The manufacturing method for QLED display of the present invention uses the white QD layer to replace the organic light-emitting layer of the WOLED structure in the WOLED process, and adds the UV photoinitiator to the white QD layer. The QDs between the sub-pixels are irreversibly quenched by UV irradiation with mask to form fine QD pattern so as to eliminate the mutual influence between adjacent sub-pixels and effectively reduce the distance between two sub-pixels, increase the aperture ratio, and improve the color gamut and contrast of the display to enhance the color expression capability of the display. The manufacturing method is simple, and saves cost and process. Compared with the conventional TFT-LCD display, the QLED display of the present invention is not required to fabricate a liquid crystal cell separately, thinner and lighter, and has a longer lifetime and higher luminous efficiency than a conventional WOLED display.

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

BRIEF DESCRIPTION OF THE DRAWINGS

The following provides a detailed description, in combination with the drawings, to explain the benefits of the present invention. In the drawings.

DETAILED DESCRIPTION OF THE PREFERRED EMBODIMENTS

To further explain the technical means and effects of the present invention, the following description refers to the drawings and preferred embodiments of the present invention.

Figure 1:
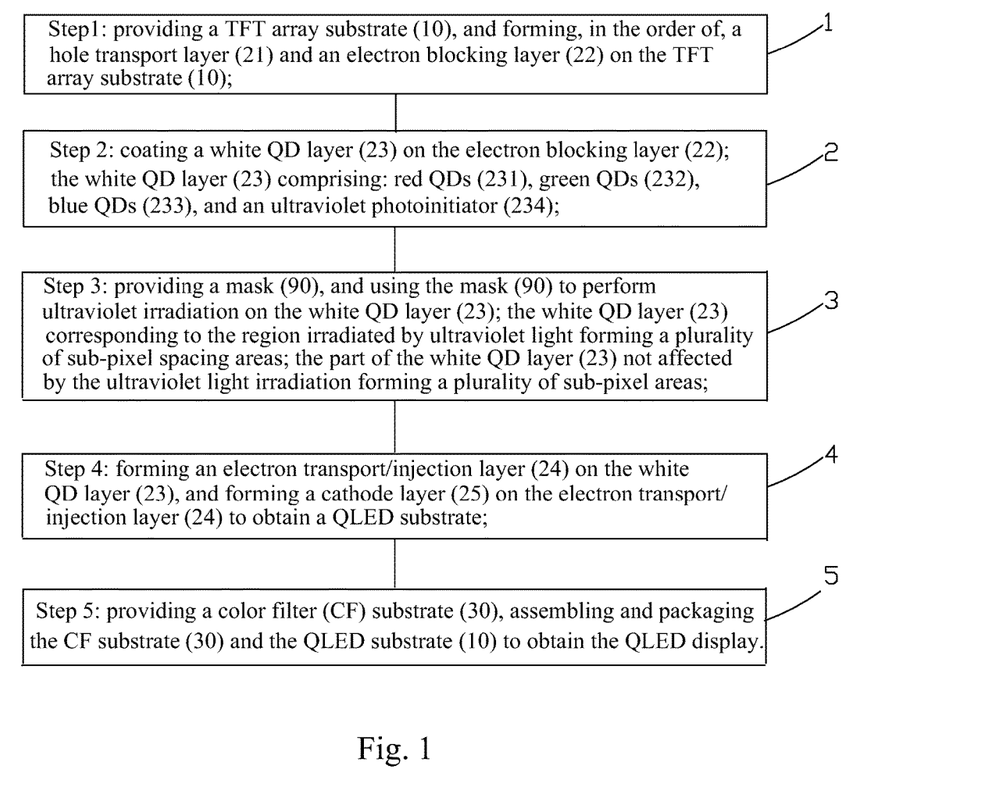
FIG. 1 is a schematic view showing the flowchart of the manufacturing method for QLED display provided by an embodiment of the present invention.
Figure 2:
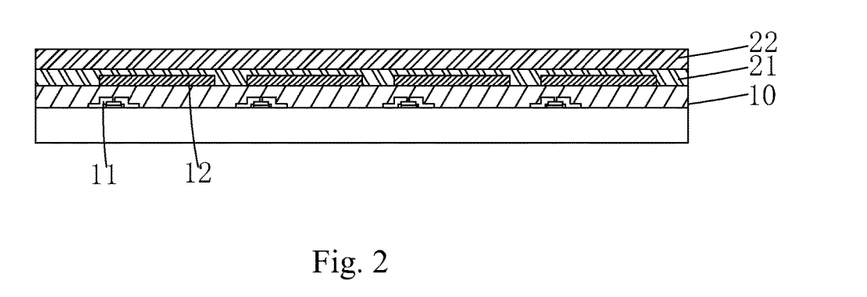
FIG. 2 is a schematic view showing Step 1 of the manufacturing method for QLED display provided by an embodiment of the present invention.

Referring to FIG. 1, the present invention provides a manufacturing method for QLED display, which comprises:

Step 1: as shown in FIG. 2, providing a TFT array substrate 10, and forming, in the order of, a hole transport layer 21 and an electron blocking layer 22 on the TFT array substrate 10.

The TFT array substrate 10 comprises a TFT layer 11, and an anode layer 12 formed on the TFT layer 11; the TFT layer 11 comprises a plurality of TFTs arranged in an array.

Specifically, in Step 1, the hole transport layer 21 and the electron blocking layer 22 are sequentially formed by a spin coating or evaporation process. The material of the hole transport layer 21 may be one of poly (3,4-ethylenedioxy-thiophene, PEDOT), and poly (N, N'-bis(4-butylphenyl)-N, N'-bis (phenyl) benzidine, Poly-TPD). The material of the electron blocking layer 22 may be selected from one of 1,2,4,5-tetrakis (trifluoromethyl) benzene (TFB), and poly (9-vinlycarbazole, PVK).

Figure 3:
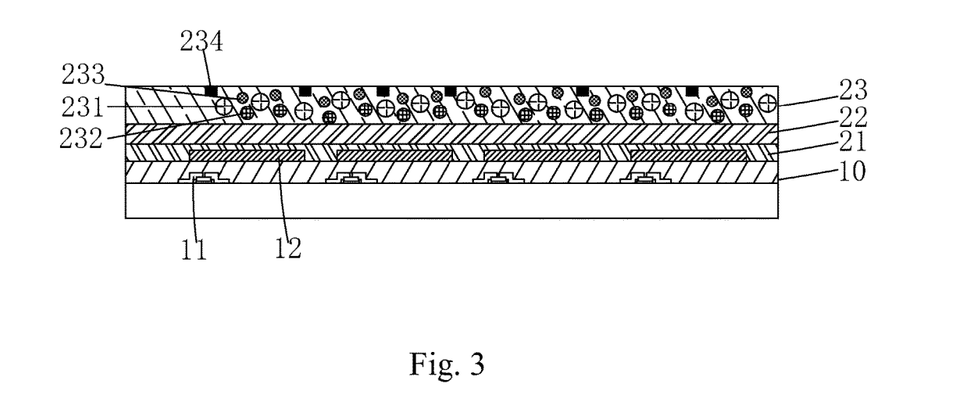
FIG. 3 is a schematic view showing Step 2 of the manufacturing method for QLED display provided by an embodiment of the present invention.

Step 2: as shown in FIG. 3, coating a white QD layer 23 on the electron blocking layer 22; the white QD layer 23 comprising: red QDs 231, green QDs 232, blue QDs 233, and an ultraviolet (UV) photoinitiator 234.

Specifically, Step 2 can be performed in two different approaches. For the first approach, Step 2 specifically comprises:

Step 21: preparing a mixed QD solution with red QDs 231, green QDs 232, blue QDs 233 and the UV photoinitiator 234.

Wherein, Step 21 is specifically to perform a surface process respectively on the red QDs 231, green QDs 232 and blue QDs 233, then dissolving the red QDs 231, green QDs 232 and blue QDs 233 in a solvent and adding ultraviolet photoinitiator 234 to obtain a mixed QD solution.

Step 22: coating the mixed QD solution on the electron blocking layer 22 by spin coating or slit coating to obtain the white QD layer 23.

For the second approach, Step 2 specifically comprises:

Step 21': preparing separately a red QD solution with red QDs 231 and ultraviolet photoinitiator 234, a green QD solution with green QDs 232 and ultraviolet photoinitiator 234, and a blue QD solution with blue QDs 232 and ultraviolet photoinitiator 234.

Wherein, Step 21' specifically is to perform a surface process respectively on the red QDs 231, green QDs 232 and blue QDs 233, so that the surface of the red QDs 231, green QDs 232 and blue QDs 233 comprising radical with or without polarity, and at this point, the red QDs 231 and the blue QDs 233 having the same surface polarity, the red QDs 231 and the green QDs 232 having opposite surface polarity, and then dissolving the red QDs 231, the green QDs 232 and the blue QDs 233 respectively in a solvent with the same polarity of the surface polarity of the respective QDs, and adding ultraviolet photoinitiator 234 respectively to obtain a red QD solution, a green QD solution and a blue QD solution. For example, perform a surface process respectively on the red QDs 231, green QDs 232 and blue QDs 233, so that the surface of the red QDs 231 and blue QDs 233 comprising radical with polarity, and the surface of the green QDs 232 comprising radicals without polarity; then dissolving the red QDs 231 and the blue QDs 233 respectively in a solvent with polarity, and dissolving the green QDs 232 in a solvent without polarity, and adding ultraviolet photoinitiator 234 respectively to obtain a red QD solution, a green QD solution, and a blue QD solution.

Step 22': coating in the order of the red QD solution, the green QD solution and the blue QD solution on the electron blocking layer 22 by spin coating or slit coating to obtain the white QD layer 23.

Specifically, in the white QD layer 23 formed in Step 2, the ratio of red QDs 231, green QDs 232 and blue QDs 233 is adjustable according to the actual application. Preferably, the ratio of the blue QDs 233 to the green QDs 232 is more than or equal to 4:1, the ratio of the green QDs 232 to the red QDs 231 is more than or equal to 1:1.

Specifically, the red QDs, the green QDs, and the blue QDs are all QDs of core-shell structure formed by one or more of group II-VI semiconductor material (such as, CdS, CdSe, HgTe, ZnS, ZnSe, ZnTe, HgS), group III-V semiconductor material (Such as InP, InAs, GaP, GaAs) and group IV-VI semiconductor material.

Specifically, the particle diameters of the red QDs 231, the green QDs 232, and the blue QDs 233 are of 1 to 10 nm.

Figure 4:
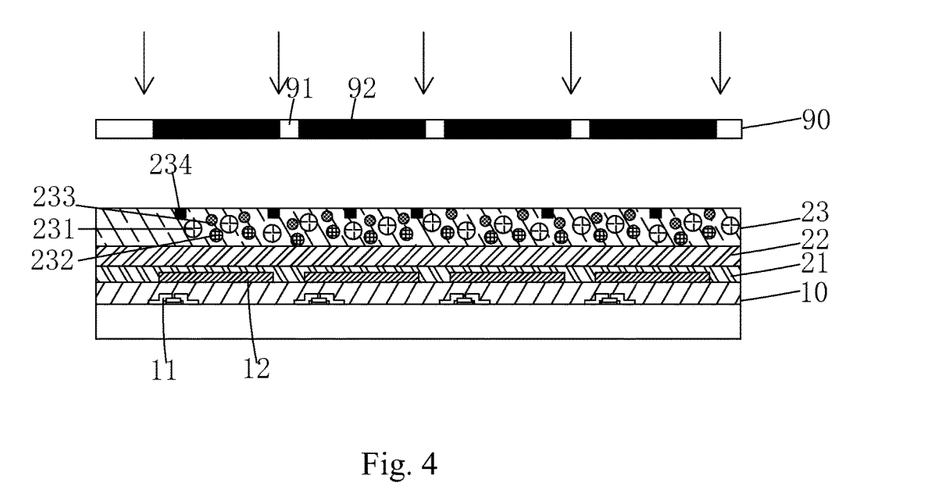
FIG. 4 is a schematic view showing Step 3 of the manufacturing method for QLED display provided by an embodiment of the present invention.

Step 3: as shown in FIG. 4, providing a mask 90, and using the mask 90 to perform ultraviolet irradiation on the white QD layer 23 for 0.5-4 h; the mask 90 comprising a light-transmitting portion 91 and an opaque portion 92, and the white QD layer 23 corresponding to the region underneath the light-transmitting portion 91 during the ultraviolet irradiation so that the ultraviolet photoinitiator 234 being subjected to ultraviolet light to cause irreversible quenching of the red, green and blue QDs 231, 232, 233 in the region to form a plurality of sub-pixel spacing areas; the part of the white QD layer 23 corresponding to the region underneath the opaque portion 92 not affected by the ultraviolet light irradiation so as to form a plurality of sub-pixel areas arranged in an array and separated by the sub-pixel spacing areas, and the plurality of sub-pixel areas and the plurality of TFTs forming a one-to-one correspondence.

Specifically, the ultraviolet photoinitiator 234 is selected from some of commonly used ultraviolet photoinitiator, such as, benzoin dimethylether (BDK) or methyl benzoylformate (MBF). The molecules of these types of initiators will not directly affect the light-emitting property of the QD material. However, after UV irradiation, the highly active radical generated by the irradiation will directly quench the QD material so that the QD material loses the original function. Therefore, during the UV irradiation in Step 3, in the part of the white QD layer 23 located under the light-transmitting portion 91, the ultraviolet photoinitiator 234 is subjected to ultraviolet light and cleaved to produce a highly electronegative free radical group having a strong electron-attracting ability, to capture excited electrons so that the excited electrons are not recombined with the holes, resulting in irreversible quenching of the red, green and blue QDs 231, 232, and 233 in the part.

Figure 5:
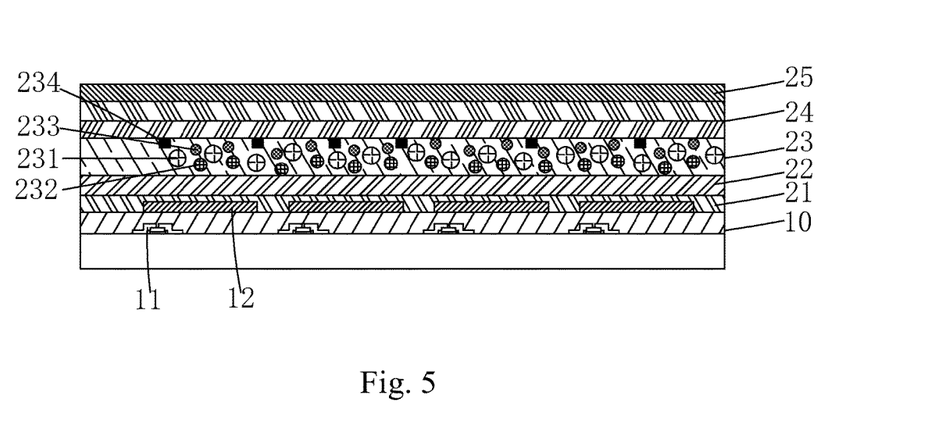
FIG. 5 is a schematic view showing Step 4 of the manufacturing method for QLED display provided by an embodiment of the present invention.

Step 4: as shown in FIG. 5, forming an electron transport/injection layer 24 on the white QD layer 23, and forming a cathode layer 25 on the electron transport/injection layer 24 to obtain a QLED substrate.

Specifically, in Step 4, a spin coating or evaporation process is used to form an electron transport/injection layer 24, and the material of the electron transport/injection layer

24 is one of tri(8-quinolinolato) aluminum (Alq3), 1,3,5-Tri (1-phenyl-1H-benzo[d]imidazol-2-yl)phenyl (TPBI), or ZnO nano-particles.

Specifically, the cathode layer 25 is formed by an evaporation process, and the material of the cathode layer 25 is silver (Ag) or magnesium (Mg), and the thickness is about 200 A°.

Figure 6:
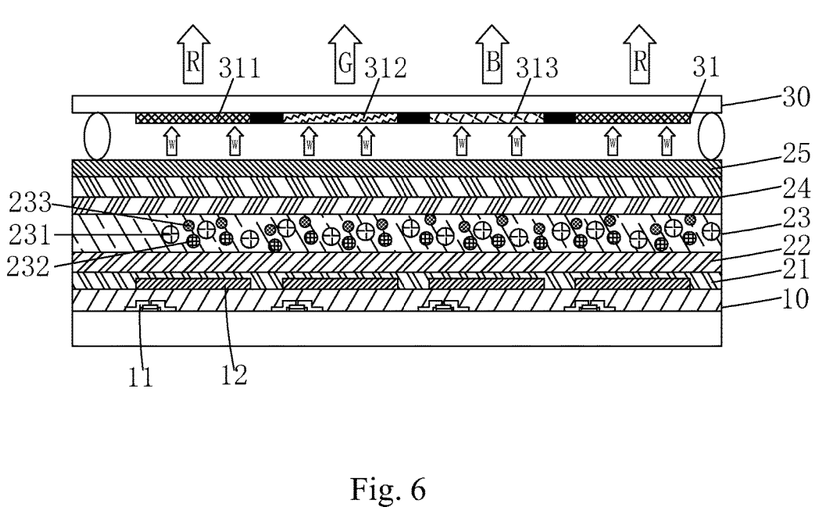
FIG. 6 is a schematic view showing Step 5 of the manufacturing method for QLED display provided by an embodiment of the present invention.

Step 5: as shown in FIG. 6, providing a color filter (CF) substrate 30, wherein the CF layer 30 comprising a CF layer 31, and the CF layer comprising a plurality of red color-resist units 311, green color-resist units 312 and blue color-resist units 313 arranged alternately; assembling and packaging the CF substrate 30 and the QLED substrate to obtain the QLED display.

The manufacturing method for QLED display of the present invention adopts the WOLED manufacturing process, and the QLED display device manufactured by the present invention has a structure of WQLED plus CF film to increase the color gamut of the display while reducing manufacturing difficulty to achieve mass production in a short time. When the manufactured QLED is lighted, the QDs in each sub-pixel spacing area of the white QD layer 23 will not emit-light under any circumstances due to the quenching by UV irradiation; hence, the mutual influence between two neighboring sub-pixels is eliminated and the distance between two sub-pixels can be effectively reduced and the aperture ratio is increased. As shown in FIG. 6, the red QDs 231, green QDs 232 and blue QDs 233 in the sub-pixels of the white QD layer 23 emit red light (R), green light (G) and blue light (B) in the excited state, respectively, and mixed to form the white light (W). Then, white light emitted from each sub-pixel passes through the red color-resist unit 311, green color-resist units 312 and the blue color-resist units 313 of the color filter layer 31, and is then filtered into three primary colors of red, green, and blue, to achieve full-color display.

In summary, the manufacturing method for QLED display of the present invention uses the white QD layer to replace the organic light-emitting layer of the WOLED structure in the WOLED process, and adds the UV photoinitiator to the white QD layer. The QDs between the sub-pixels are irreversibly quenched by UV irradiation with mask to form fine QD pattern so as to eliminate the mutual influence between adjacent sub-pixels and effectively reduce the distance between two sub-pixels, increase the aperture ratio, and improve the color gamut and contrast of the display to enhance the color expression capability of the display. The manufacturing method is simple, and saves cost and process. Compared with the conventional TFT-LCD display, the QLED display of the present invention is not required to fabricate a liquid crystal cell separately, thinner and lighter, and has a longer lifetime and higher luminous efficiency than a conventional WOLED display.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method for quantum dot light-emitting diode (QLED) display, which comprises:
    Step 1: providing a TFT array substrate, and forming, in the order of, a hole transport layer and an electron blocking layer on the TFT array substrate;
    the TFT array substrate comprising a TFT layer, and an anode layer formed on the TFT layer; the TFT layer comprising a plurality of TFTs arranged in an array;
    Step 2: coating a white QD layer on the electron blocking layer; the white QD layer comprising: red QDs, green QDs, blue QDs, and an ultraviolet photoinitiator;
    Step 3: providing a mask, and using the mask to perform ultraviolet irradiation on the white QD layer; the mask comprises a light-transmitting portion and an opaque portion, and the white QD layer corresponding to a region underneath the light-transmitting portion during the ultraviolet irradiation so that the ultraviolet photoinitiator being subjected to ultraviolet light to cause irreversible quenching of the red, green and blue QDs in the region to form a plurality of sub-pixel spacing areas; a part of the white QD layer corresponding to a region underneath the opaque portion not affected by the ultraviolet light irradiation so as to form a plurality of sub-pixel areas arranged in an array and separated by the sub-pixel spacing areas, and the plurality of sub-pixel areas and the plurality of TFTs forming a one-to-one correspondence;
    Step 4: forming an electron transport/injection layer on the white QD layer, and forming a cathode layer on the electron transport/injection layer to obtain a QLED substrate;
    Step 5: providing a color filter (CF) substrate, assembling and packaging the CF substrate and the QLED substrate to obtain the QLED display;
    wherein Step 2 comprises:
    Step 21': performing a surface process respectively on the red QDs, green QDs and blue QDs, so that the surface of the red QDs, green QDs and blue QDs comprising polar or non-polar radicals, and at this point, the red QDs and the blue QDs having the same surface polarity, the red QDs and the green QDs having opposite surface polarity, and then dissolving the red QDs, the green QDs and the blue QDs in a solvent with the same polarity of the surface polarity of the respective QDs, and adding ultraviolet photoinitiator respectively to obtain a red QD solution with red QDs and ultraviolet photoinitiator, a green QD solution with green QDs and ultraviolet photoinitiator, a blue QD solution with blue QDs and ultraviolet photoinitiator;
    Step 22': coating in the order of the red QD solution, the green QD solution and the blue QD solution on the electron blocking layer by spin coating or slit coating to obtain the white QD layer.

2. The manufacturing method for QLED display as claimed in claim 1, wherein in the white QD layer formed in Step 2, a ratio of the blue QDs to the green QDs is more than or equal to 4:1, a ratio of the green QDs to the red QDs is more than or equal to 1:1.

3. The manufacturing method for QLED display as claimed in claim 1, wherein the red QDs, the green QDs, and the blue QDs are all QDs of core-shell structure formed by one or more of group II-VI semiconductor material, group III-V semiconductor material and group IV-VI semiconductor material, and the particle diameters of the red QDs, the green QDs, and the blue QDs are of 1 to 10 nm.

4. The manufacturing method for QLED display as claimed in claim 1, wherein the ultraviolet photoinitiator is benzoin dimethylether or methyl benzoylformate.

5. The manufacturing method for QLED display as claimed in claim 1, wherein in Step 3, a violet irradiation time is from 0.5 to 4 hours.

6. The manufacturing method for QLED display as claimed in claim 1, wherein in Step 1, a spin coating or evaporation process is used to form in the order of the hole transport layer and the electron blocking layer, a material of the hole transport layer is PEDOT or Poly-TPD, and a material of the electron blocking layer is TFB or PVK.

7. The manufacturing method for QLED display as claimed in claim 1, wherein in Step 4, a spin coating or evaporation process is used to form the electron transport/injection layer, and a material of the electron transport/injection layer is Alq3, TPBI, or ZnO nano-particles; the cathode layer is formed by an evaporation process, and a material of the cathode layer is silver or magnesium.

8. The manufacturing method for QLED display as claimed in claim 1, wherein the CF substrate comprises a CF layer, and the CF layer comprises a plurality of red color-resist units, green color-resist units and blue color-resist units arranged alternately.

9. A manufacturing method for quantum dot light-emitting diode (QLED) display, which comprises:
Step 1: providing a TFT array substrate, and forming, in the order of, a hole transport layer and an electron blocking layer on the TFT array substrate;
the TFT array substrate comprising a TFT layer, and an anode layer formed on the TFT layer; the TFT layer comprising a plurality of TFTs arranged in an array;
Step 2: coating a white QD layer on the electron blocking layer; the white QD layer comprising: red QDs, green QDs, blue QDs, and an ultraviolet photoinitiator;
Step 3: providing a mask, and using the mask to perform ultraviolet irradiation on the white QD layer; the mask comprises a light-transmitting portion and an opaque portion, and the white QD layer corresponding to a region underneath the light-transmitting portion during the ultraviolet irradiation so that the ultraviolet photoinitiator being subjected to ultraviolet light to cause irreversible quenching of the red, green and blue QDs in the region to form a plurality of sub-pixel spacing areas; a part of the white QD layer corresponding to a region underneath the opaque portion not affected by the ultraviolet light irradiation so as to form a plurality of sub-pixel areas arranged in an array and separated by the sub-pixel spacing areas, and the plurality of sub-pixel areas and the plurality of TFTs forming a one-to-one correspondence;
Step 4: forming an electron transport/injection layer on the white QD layer, and forming a cathode layer on the electron transport/injection layer to obtain a QLED substrate;
Step 5: providing a color filter (CF) substrate, assembling and packaging the CF substrate and the QLED substrate to obtain the QLED display;
wherein the CF substrate comprising a CF layer, and the CF layer comprising a plurality of red color-resist units, green color-resist units and blue color-resist units arranged alternately;
wherein the ultraviolet photoinitiator being benzoin dimethylether or methyl benzoylformate; and
wherein Step 2 specifically comprises:
Step 21': performing a surface process respectively on the red QDs, green QDs and blue QDs, so that the surface of the red QDs, green QDs and blue QDs comprising polar or non-polar radicals, and at this point, the red QDs and the blue QDs having the same surface polarity, the red QDs and the green QDs having opposite surface polarity, and then dissolving the red QDs, the green QDs and the blue QDs in a solvent with the same polarity of the surface polarity of the respective QDs, and adding ultraviolet photoinitiator respectively to obtain a red QD solution with red QDs and ultraviolet photoinitiator, a green QD solution with green QDs and ultraviolet photoinitiator, a blue QD solution with blue QDs and ultraviolet photoinitiator;
Step 22': coating in the order of the red QD solution, the green QD solution and the blue QD solution on the electron blocking layer by spin coating or slit coating to obtain the white QD layer.

10. The manufacturing method for QLED display as claimed in claim 9, wherein in the white QD layer formed in Step 2, a ratio of the blue QDs to the green QDs is more than or equal to 4:1, a ratio of the green QDs to the red QDs is more than or equal to 1:1.

11. The manufacturing method for QLED display as claimed in claim 9, wherein the red QDs, the green QDs, and the blue QDs are all QDs of core-shell structure formed by one or more of group II-VI semiconductor material, group III-V semiconductor material and group IV-VI semiconductor material, and the particle diameters of the red QDs, the green QDs, and the blue QDs are of 1 to 10 nm.

12. The manufacturing method for QLED display as claimed in claim 9, wherein in Step 3, a violet irradiation time is from 0.5 to 4 hours.

13. The manufacturing method for QLED display as claimed in claim 9, wherein in Step 1, a spin coating or evaporation process is used to form in the order of the hole transport layer and the electron blocking layer, a material of the hole transport layer is PEDOT or Poly-TPD, and a material of the electron blocking layer is TFB or PVK.

14. The manufacturing method for QLED display as claimed in claim 9, wherein in Step 4, a spin coating or evaporation process is used to form the electron transport/injection layer, and a material of the electron transport/injection layer is Alq3, TPBI, or ZnO nano-particles; the cathode layer is formed by an evaporation process, and a material of the cathode layer is silver or magnesium.

* * * * *